United States Patent
Yang et al.

(10) Patent No.: US 9,425,816 B1
(45) Date of Patent: Aug. 23, 2016

(54) GENERATING COMPARATOR THRESHOLDS USING A ROTATING RING OF RESISTORS

(71) Applicant: ANALOG DEVICES GLOBAL, Hamilton (BM)

(72) Inventors: Wenhua W. Yang, North Andover, MA (US); Richard E. Schreier, Toronto (CA)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/730,095

(22) Filed: Jun. 3, 2015

(51) Int. Cl.
*H03M 1/66* (2006.01)
*H03M 1/80* (2006.01)
*H03M 1/00* (2006.01)
*H03M 1/68* (2006.01)
*H03M 3/00* (2006.01)

(52) U.S. Cl.
CPC ............. *H03M 1/808* (2013.01); *H03M 1/002* (2013.01); *H03M 1/685* (2013.01); *H03M 3/32* (2013.01); *H03M 3/50* (2013.01)

(58) Field of Classification Search
CPC ................. H03M 1/46; H03M 1/785; H03M 2201/3168; H03M 3/504; H03M 2201/119; H03M 1/808; H03M 1/685; H03M 3/50; H03M 1/002; H03M 3/32
USPC .................. 341/110, 155, 148, 136, 156, 145
See application file for complete search history.

(56) References Cited

U.S. PATENT DOCUMENTS

| | | | |
|---|---|---|---|
| 4,459,580 A | 7/1984 | Furukawa | |
| 4,638,303 A * | 1/1987 | Masuda | H03M 1/682 341/136 |
| 4,749,984 A * | 6/1988 | Prost | H03M 1/00 324/99 D |
| 6,218,977 B1 * | 4/2001 | Friend | H03M 1/0668 341/148 |
| 6,621,440 B2 | 9/2003 | Gorman | |
| 6,762,702 B2 | 7/2004 | Kwan | |
| 7,002,504 B2 | 2/2006 | McMahill | |
| 7,227,491 B2 * | 6/2007 | Doerrer | H03M 1/0668 341/155 |
| 7,777,658 B2 | 8/2010 | Nguyen et al. | |
| 2004/0189504 A1 * | 9/2004 | Dasgupta | H03M 1/144 341/156 |
| 2012/0068865 A1 * | 3/2012 | Chae | H03M 1/067 341/110 |
| 2012/0206154 A1 * | 8/2012 | Pant | G06F 3/0416 324/613 |

OTHER PUBLICATIONS

Kester, Walt, "ADC Architectures I: The Flash Converter", MT-020 Tutorial, Analog Devices, Rev. A, 10/08, WK, © 2009 Analog Devices, Inc., 15 pages.
Säll, Erik et al., "A Dynamic Element Matching Technique for Flash Analog-to-Digital Converters", Proceedings of the 6th Nordic Signal Processing Symposium—NORSIG 2004, Jun. 9-11, 2004, Espoo, Finland, 4 pages.

* cited by examiner

*Primary Examiner* — Jean B Jeanglaude
(74) *Attorney, Agent, or Firm* — Patent Capital Group

(57) ABSTRACT

Data converters convert signals in analog form to digital form or from digital form to analog form. Due to mismatches between devices that are intended to be identical (unary elements), some data converters outputs may have undesirable characteristics, such as non-linearities. Shuffling the inputs to the unary elements based on a pseudo-random sequence is a technique that can average out the mismatches over time. However, shuffling generally requires a complex switch matrix, and can potentially impact the speed of the converter. To address mismatches, a high speed technique for rotating comparator thresholds is implemented to effectively rotate an array of unary digital-to-analog converter elements. The technique is particularly advantageous for addressing mismatches in unary digital-to-analog converters used for reconstructing a quantized analog signal within delta-sigma analog-to-digital converter.

20 Claims, 10 Drawing Sheets

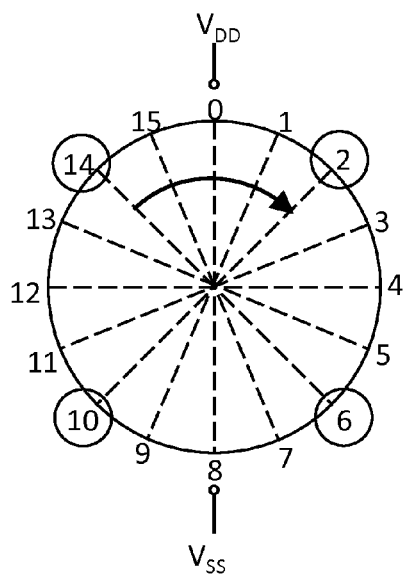
FIGURE 4
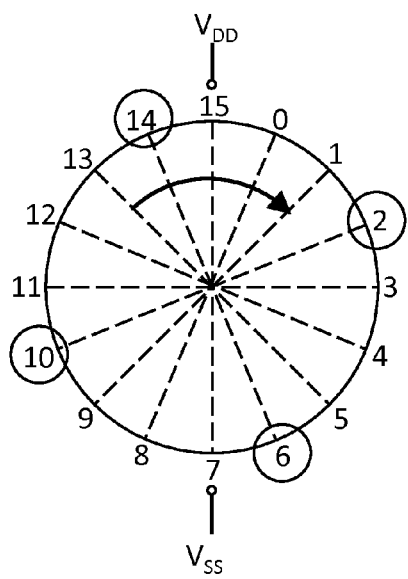 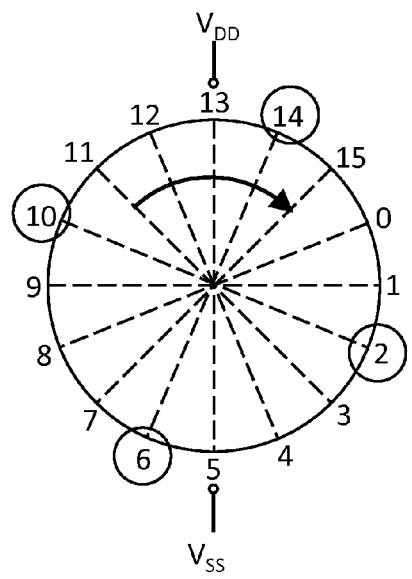
FIGURE 5A              FIGURE 5B

GENERATING COMPARATOR THRESHOLDS USING A ROTATING RING OF RESISTORS

TECHNICAL FIELD OF THE DISCLOSURE

The present invention relates to the field of integrated circuits, in particular to generating comparator thresholds using a rotating ring of resistors.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size.

BRIEF SUMMARY OF THE DISCLOSURE

Data converters convert signals in analog form to digital form or from digital form to analog form. Due to mismatches between devices that are intended to be identical (unary elements), some data converters outputs may have undesirable characteristics, such as non-linearities. Shuffling the inputs to the unary elements based on a pseudo-random sequence is a technique that can average out the mismatches over time. However, shuffling generally requires a complex switch matrix, and can potentially impact the speed of the converter. To address mismatches, a high speed technique for rotating comparator thresholds is implemented to effectively rotate an array of unary digital-to-analog converter elements. The technique is particularly advantageous for addressing mismatches in unary digital-to-analog converters used for reconstructing a quantized analog signal within a delta-sigma analog-to-digital converter.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 4 shows an illustrative ring of resistors having tabs between resistors, said ring of resistors configured to generate a plurality of comparator thresholds, according to some embodiments of the disclosure;

FIGS. 5A-F shows an illustrative ring of resistors undergoing a "step by two" rotation of connections in a ring of resistors for generating comparator thresholds, according to some embodiments of the disclosure;

DESCRIPTION OF EXAMPLE EMBODIMENTS OF THE DISCLOSURE

Figure 1:
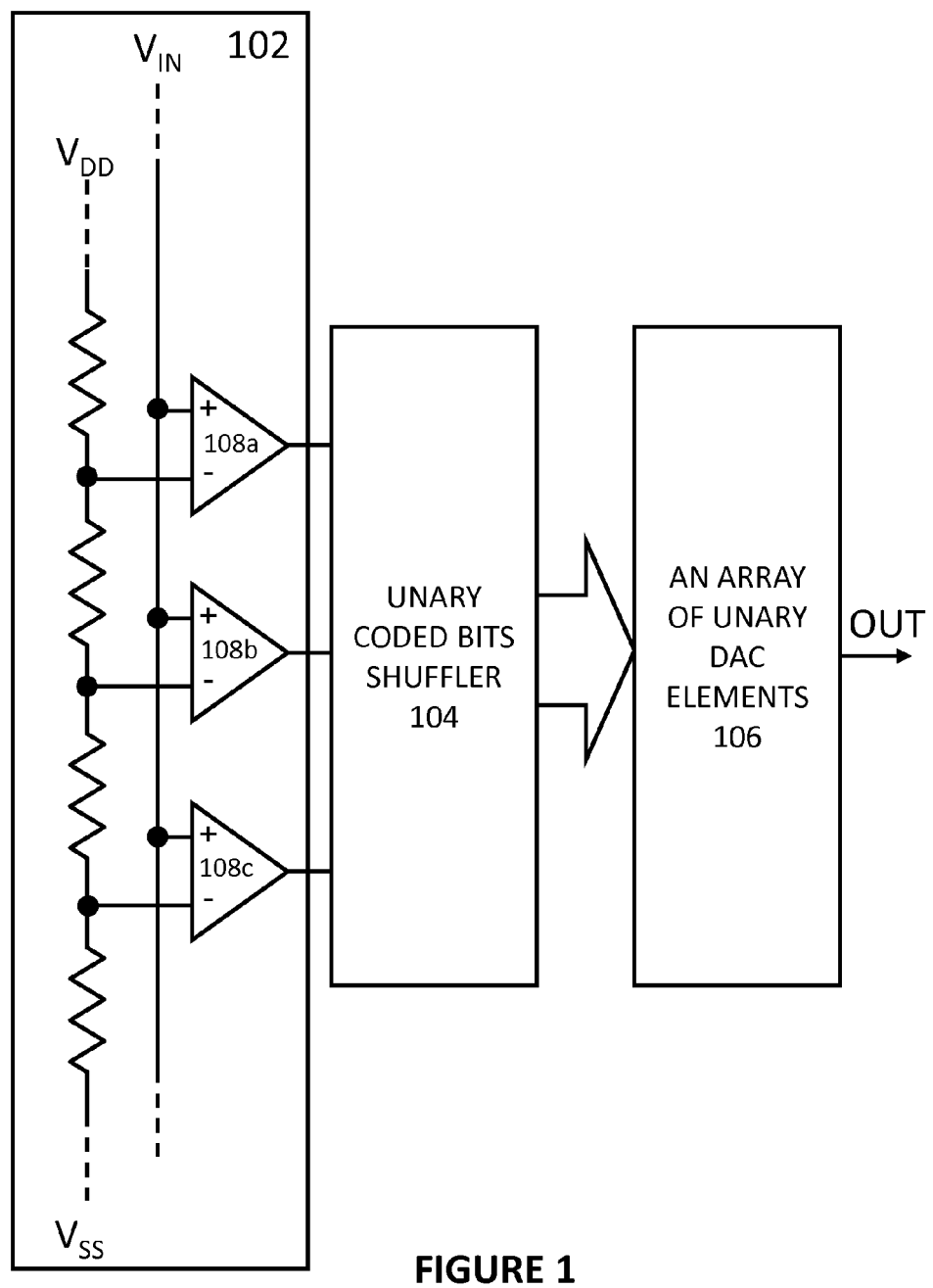
FIG. 1 shows an exemplary architecture having a quantizer, a shuffler, and an array of digital-to-analog converter elements, according to some embodiments of the disclosure.

Understanding Data Converters which Involve Reconstructing a Quantized Signal Data converters come in many different flavors. The present disclosure describes a flavor of converters, in particular, analog-to-digital converter (ADC) involving reconstruction of a quantized signal. Some ADCs use an analog-to-digital converter in a first stage (sometimes referred to as a quantizer, or a flash ADC, having only a few or several bits of resolution), which would coarsely convert an analog input signal into a quantized signal, and subsequently reconstruct the quantized signal into an analog signal so that the residue, i.e., the difference between the original analog input signal and the reconstructed analog signal, can be converted by a second stage. One exemplary flavor of ADCs that uses employs this technique is the delta-sigma ADC; other examples include sub-ranging ADCs and pipeline ADCs. For delta-sigma ADCs, a lower resolution ADC and DAC coarsely quantize an analog input signal and reconstruct the analog signal, and a loop filter suppresses quantization noise in the band of interest. While the present disclosure describes embodiments associated with delta-sigma ADCs, it is envisioned that the embodiments are also applicable to other ADCs having a quantizer whose output is reconstructed into an analog signal.

For a delta-sigma ADC, a quantizer having an array of comparators drives an array digital-to-analog converter (DAC) elements, whose outputs, when combined, reconstructs an analog input signal to the quantizer. Typically, the array of DAC elements are nominally the same; the array of DAC elements comprises a plurality of unary DAC elements where each DAC element counts as one. The quantizer output, i.e., the output code (e.g., a unary code of 0's and 1's), would "turn on" an appropriate number of unary DAC elements to generate the reconstructed analog signal that is equivalent to the quantizer output. Ideally, the unary DAC elements are exactly the same as each other, thereby providing a perfect reconstructed analog signal that is precisely equivalent to the quantizer output. When an input having equal steps is applied, the output would ideally exhibit equal steps. However, the array of DAC elements are not always matched with respect to each other, where mismatches between the DAC elements introduce mismatch errors in the analog output signal. For instance, static mismatches in size due to limits in fabrication can contribute to non-linearities in the reconstructed analog output signal. In some instances, temperature changes and so forth can also contribute to non-linearities in the reconstructed analog output signal. Non-linearities in the reconstructed analog output signal can affect the overall linearity of the delta-sigma ADC because the non-linearities introduced by the array of DAC elements in the feedback path does not get attenuated by the loop filter of the delta-sigma ADC.

An Example of Conventional Shuffling of Unary Coded Bits

Element shuffling is a common technique to overcome the above mentioned unary-DAC mismatches, which is commonly done in the digital domain through remapping or shuffling of unary (thermometer) coded bits to the unary DAC elements, where the remapping randomizes the application of the unary DAC elements based on a pseudo-random number sequence. As a result, the DAC elements are used for the same amount over time to mitigate the effect of the DAC element mismatch. Without shuffling, the bottom DAC elements (if the array is stacked "vertically") would be used more often than the top DAC elements since the top DAC elements are used if the input signal is near full scale. With shuffling, the DAC elements are used equally, even though each element is still mismatched, any mismatches would be averaged out over time (where the effective weight of any given DAC element would be the average weight over all DAC elements).

FIG. 1 shows an exemplary architecture having a quantizer 102, a (unary coded bits) shuffler 104, and an array of (unary) DAC elements 106, according to some embodiments of the disclosure. The quantizer 102 includes an array of comparators (e.g., comparators 108a-c). Each comparator compares an analog input signal $V_{IN}$ (at the positive terminal of the comparator) against a respective comparator threshold (at the negative terminal of the comparator). For instance, the comparator 108a compares the analog input signal $V_{IN}$ against a first comparator threshold voltage, the comparator 108b compares the analog input signal $V_{IN}$ against a second comparator threshold voltage, and so on. In the example shown, the comparator thresholds are generated by a resistor ladder, i.e., a string of resistors whose ends are tied to a first power supply $V_{DD}$ and a second power supply $V_{SS}$ respectively. The parallel comparisons performed by the array of comparators generate a unary code of 0's and 1's (respective outputs of the comparators) which reflects the value of the analog input signal $V_{IN}$. The unary code, i.e., the output of the quantizer, is then shuffled to different unary DAC elements by the shuffler 104 so that the unary DAC elements in the array of unary DAC elements 106 are used equally over time to average out the DAC mismatches.

Rotating Flash Comparator Thresholds

Instead of shuffling the unary coded bits in the digital domain at the output of the quantizer, the present disclosure describes a different technique where the comparator thresholds (i.e., inputs to the quantizer) are rotated in the analog domain to effectively rotate the array of unary DAC elements. The outputs of the comparators (whose comparator thresholds are being rotated) are connected to the DAC elements in a one-to-one relationship, so rotating the comparator thresholds rotates the comparators and in turns rotates the DAC elements. The technique provides for fast rotation of connections of a ring of resistors (not a string) configured for generating the comparator thresholds for an array of comparators (the array of comparators driving an array of DAC elements).

Figure 2:
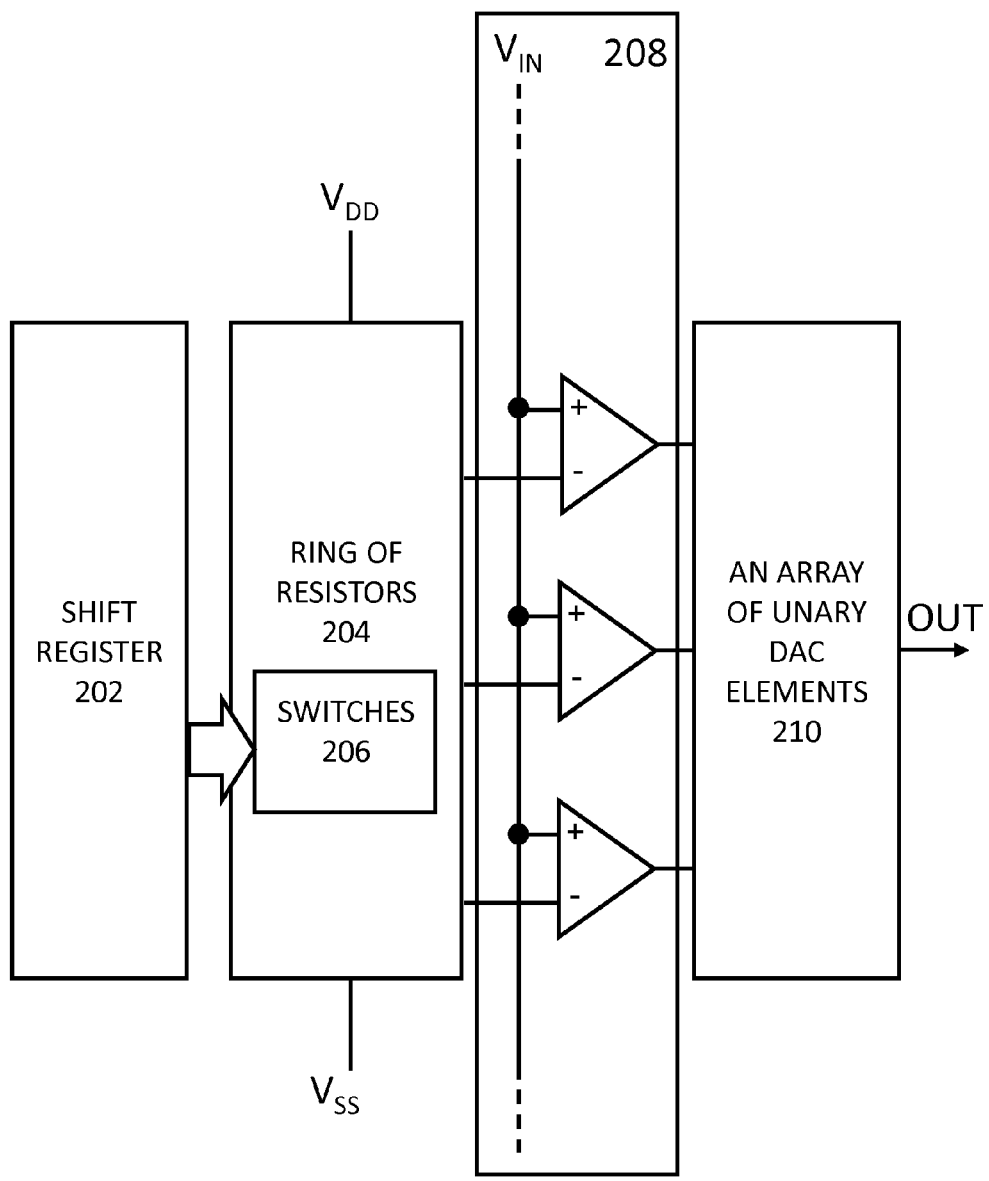
FIG. 2 shows an exemplary architecture for fast rotation of connections of a ring of resistors configured for generating comparator thresholds, according to some embodiments of the disclosure.

FIG. 2 shows an exemplary architecture for fast rotation of connections of a ring of resistors configured for generating comparator thresholds, according to some embodiments of the disclosure. A circuit having such architecture can include a ring of resistors 204 having tabs between resistors, a plurality of switches 206 configured to connect tabs between resistors in a ring of resistors to a first reference level (e.g., a first power supply, $V_{DD}$, a first reference voltage, etc.) or to a second reference level (e.g., a second power supply, $V_{SS}$, a second reference voltage), a shift register 202 for generating control signals for the plurality of switches, wherein the control signals selectively connect a first selected tab to the first reference level and a second selected tab to the second reference level to generate a plurality of comparator thresholds at a plurality of pre-selected pairs of tabs in the ring of resistors, and an array of comparators 208 for driving an array of (unary) DAC elements 210, wherein each comparator is connected to a respective pre-selected pair of tabs in the ring of resistors.

The technique employs a shift register for generating control signals which selectively connect a first selected tab in the ring of resistors to the first reference level and a second selected tab in the ring of resistors to the second reference level. Specifically, the shift register generates control signals for a plurality of switches configured to connect tabs between resistors in a ring of resistors to a first reference level or to a second reference level, and the control signals selectively connects a first selected tab to the first reference level and a second selected tab to the second reference level to generate a plurality of comparator thresholds at a plurality of pre-selected pairs of tabs in the ring of resistors. Advantageously, the comparator thresholds taken at the pre-selected pairs of tabs in the ring of resistors rotates quickly with predictable latency through the possible comparator thresholds as the positions of the first selected tab and the second selected tab rotate over the ring of resistors. This solution, in particular, is able to rotate the comparator thresholds relatively quickly due to the lack of a decoder. The array of comparators generates a unary code based an input signal to each of the comparators and the plurality of comparator thresholds, and the array of DAC elements converts the unary code into a quantized analog signal, whose error caused by element mismatch are reduced by the rotation of connections.

In the ring of resistors, the pre-selected pairs of tabs (e.g., at evenly spaced positions in the ring) for outputting comparator thresholds are fixed as the connections for connecting tabs to a first reference level ($V_{DD}$) and a second reference level ($V_{SS}$) are rotated over the ring over time. Each pre-selected pair of tabs for outputting a comparator threshold provides a positive reference and a negative reference, whose voltage difference is used as the comparator threshold. Two opposite tabs in the ring of resistors are selected as the first selected tab and the second selected tab (different tabs are selected for each time period) to connect to a first reference level ($V_{DD}$) and a second reference level ($V_{SS}$) respectively at a given time period. When the connections to the first and second reference levels rotate over the ring, shifting one or more positions between time periods, the comparator thresholds provided by the pre-selected pairs of tabs rises and falls. Effectively, as the connections for the tabs of the ring of resistors rotate, comparator threshold voltages also rotates for a given pre-selected pair of tabs. The result is a ring of resistors which can generate a plurality of different comparator thresholds, where the outputs for the comparator thresholds rotates over possible comparator threshold voltage values.

Rotating Using a Shift Register is Advantageous Over Other Techniques

Although moving the shuffling function from digital (shuffling unary code bits) to analog (comparator thresholds) may seem contrary to the trend of moving analog function to digital domain, it may be particularly suitable for high speed ADCs, especially high-speed continuous-time delta-sigma ADCs that are pushing the process limit on clock rate. In high speed ADCs, any time taken up by the digital shuffler means that the clock period must be extended by the same amount, which results in slower clock rate and less available bandwidth. On the other hand, the comparators in the quantizer typically have half of a clock period (in a regeneration phase) in which the preamp is not active, and during this time, the comparator thresholds can be rotated a negative impact on clock rate. Perhaps a less subtle effect of rotating the comparator thresholds is the ability for the rotation to aid in reducing aging drifts in the circuit by allowing the comparator thresholds to change for each comparator, thus preventing uneven stress conditions being imposed on the array of comparators over time. Aging can be a challenge in designs in sub-micron processes (e.g., 28 nanometer nodes or smaller). The embodiments described herein, can be readily applied to the rotation scheme described in U.S. Provisional Application No. 62/131,725, titled "LIMITING AGING EFFECTS IN ANALOG DIFFERENTIAL CIRCUITS".

Rotation of comparator thresholds is also better in some respects when compared with a technique which generates the thresholds with a resistor string and uses a switch matrix of that connects each of the N comparators to any of the N comparator thresholds. For instance, each comparator threshold has N switches in parallel, and the total number of switches in the switch matrix is thus is N*N. The switch matrix can limit the resolution of the quantizer and DAC elements to 3-4 bits (where N is less than 16), because beyond N greater than 16, the complexity gets too high and the switch matrix becomes too slow due to parasitic capacitance of the parallel switches. Secondly, the analog switch matrix can be difficult to implement when the thresholds span mid-supply where neither PMOS (P-type metal oxide semiconductor field effect transistor) nor NMOS (N-type metal oxide semiconductor field effect transistor) switch turn on well. It gets even more problematic if the threshold span a significant portion of the supply (>25%), in such case a simple boosting of the switch drive does not work either.

By reducing complexity and taking advantage of sequential rotation (rather than implementing a full N-to-1 multiplexer matrix), some of these issues can be addressed. The rotating comparator thresholds, i.e., a rotating ring of resistors, takes advantage of the sequential rotation (as opposed to offering a full matrix allowing connection of any threshold to any comparator without constraint) to reduce complexity. Instead of having a switch matrix, the comparators are directly connected to the ring of resistor at the pre-selected pairs of tabs, and the ring of resistors is rotated by controlling a limited number of switches that can connect a first selected tab and a second selected tab of the ring (e.g., opposite tabs in the ring) to the first reference level and the second reference level respectively (i.e., to positive and negative full scale or reference). The number of switches is greatly reduced to a linear relationship, e.g., N or 2N, instead of N*N, which can be advantageous for high speed designs. In addition, there are no switches in series between comparator thresholds and comparators, since all the switches are connects tabs in the ring of resistors to the first reference level or the second reference level. Such a characteristic means that PMOS and NMOS switches can be used to implement the circuit without boosted gate drive. Furthermore, rotation of the ring of resistors means the (incremental) change in voltage in the comparator thresholds between time periods can be smaller when compared against change in voltage in the comparator thresholds generated using the technique having the full switch matrix. Smaller change in voltage means the comparator thresholds would settle faster, making it easier to meet requirements in settling time for a faster ADC.

Using a shift register (instead of a combination of an up and down counter and decoder) to generate the control signals for rotating the connections also has some advantages. A shift register has considerably more predictable timing or input-to-output delays (i.e., input-to-output delay of one flip-flop) when compared to a decoder (where the input-to-output delay can vary as depending on the output due to having to traverse through different gates to reach the output). Not having predictable timing or delay can be an issue if timing cannot be controlled accurately for high speed applications.

Examining a Ring of Resistor in Detail

A ring of resistors, as described herein, refers to a plurality of resistors connected in series to form loop. The ring of resistors thus includes a plurality of resistors where any given one resistor in the ring of resistors is connected to two other resistors, one on each terminal of the given resistor. The terminals connecting adjacent resistors forms a node between the adjacent resistors, and such a node is referred herein a tab in the ring of resistors. For a ring of X number of resistors, there are thus X tabs having different respective positions along the ring of resistors. Phrased differently, the tabs between the resistors in the ring of resistors have respective positions in the ring.

Figure 3:
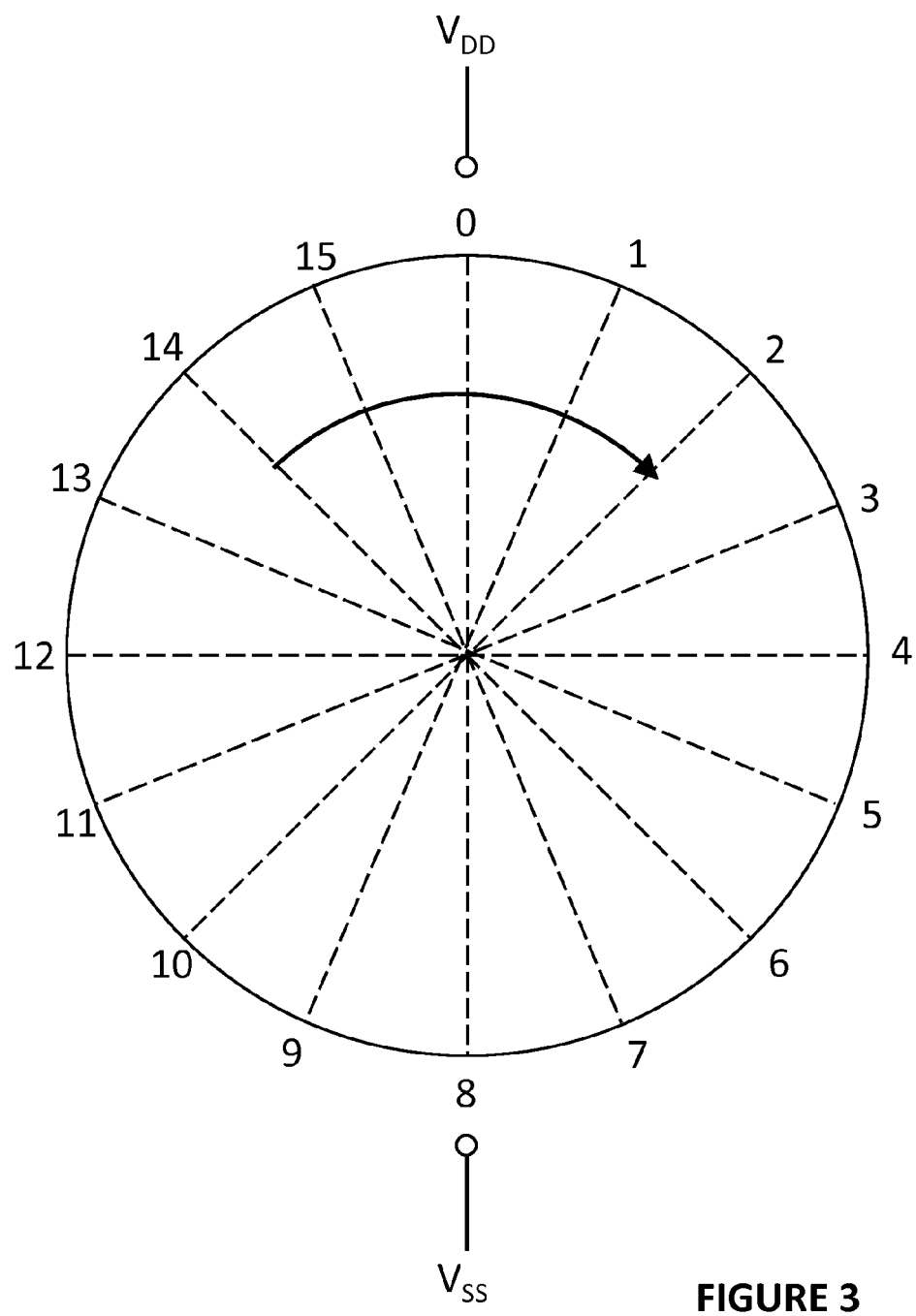
FIG. 3 shows an illustrative ring of resistors having tabs between resistors, according to some embodiments of the disclosure.

FIG. 3 shows an illustrative ring of resistors having tabs between resistors, according to some embodiments of the disclosure. In this example, the ring of resistors is illustrated by a circle, whose 16 arc segments of the circle represents resistors in the ring. This ring of resistors thus has 16 resistors, and there are 16 tabs along the ring of resistors (labeled 0 to 15, corresponding to the tabs' respective positions in the ring).

Example

Fast Rotation of Connections of a Ring of Resistors Generating Four Comparator Thresholds FIG. 4 shows an illustrative ring of resistors having tabs between resistors, said ring of resistors configured to generate a plurality of comparator thresholds, according to some embodiments of the disclosure. A plurality of comparator thresholds are taken at pre-selected pairs of tabs in the ring of resistors. In this example shown in FIG. 4, the ring of resistors is divided evenly by four pre-selected tabs [tab2, tab6, tab10, and tab14], and a number of comparator thresholds with a number of different voltage levels, can be generated at pre-selected pairs of tabs: [tab14,tab6], [tab10,tab2], [tab6,tab14], and [tab2,tab10] in this particular example.

Suppose tab0 and tab8 are connected to a first reference level ($V_{DD}$) and a second reference level ($V_{SS}$), as illustrated in FIG. 4, four comparator thresholds can be generated with two distinct voltage levels at the pre-selected pairs of tabs: [tab14,tab6], [tab10,tab2], [tab6,tab14], and [tab2,tab10]. Note that tab0 and tab8 symmetrically split the resistor strings between adjacent tabs, e.g., the resistor string between [tab2,tab14] and the resistor string between [tab6,tab10]. For that reason, the comparator threshold at [tab14,tab6] and the comparator threshold at [tab2,tab10] are at the same voltage level, and the comparator threshold at [tab6,tab14] and the comparator threshold at [tab10,tab2] are at the same voltage level.

Two pre-selected tabs (i.e., a pair of pre-selected tabs), e.g., tab14 and tab6, can generate two comparator thresholds at a given time period, e.g., threshold tab14-tab6 and threshold tab6-tab14. A first comparator threshold can be generated using a first selected tab as the positive reference voltage and the second selected tab as the negative reference voltage; a second comparator threshold can be generated using the second selected tab as the positive reference voltage and the first selected tab as the negative reference voltage. Preferably, the pre-selected pairs of tabs are spaced evenly across the ring of resistors.

The ring of resistors is effectively rotated (note it is not physically rotated in space) by changing which two selected tabs are connected to a first reference level ($V_{DD}$) and a second reference level ($V_{SS}$) during a given time period. As the ring of resistors "rotate", i.e., the positions of the two selected tabs rotate, or "shift in position", over the ring of resistors, e.g., by stepping at least one position between time periods, the comparator thresholds at pre-selected pairs of tabs rotates through possible comparator threshold voltage levels. The tabs between the resistors in the ring of resistors have respective positions in the ring; through control signals generated by the shift register, a first position associated with the first selected tab and a second position associated with the second selected tab are shifted by a pre-selected number of positions between time periods. For instance, the pre-selected number of positions is two, the control signals changes between time periods to select the tabs that are two positions over (e.g., moving two positions over in the same direction from the first position and the second position) in the ring of resistors as the first selected tab and the second selected tab for the next time period. In another instance, the pre-selected number of positions is four, the control signals changes between time periods to select the tabs that are four positions in the ring of resistors over as the first selected tab and the second selected tab for the next time period. Any suitable number can be used as the pre-selected number of positions. The two selected tabs are preferably "opposite of each other" in the ring of resistors to allow the ring to form two resistive dividers: one on the left hand side and one on the right hand side. As a result, the comparator thresholds (taken at pre-selected pairs of tabs) rotate over the possible comparator threshold voltage values as the two selected tabs rotate over the ring of resistors.

For the ring of resistors shown in FIG. 4, four comparator thresholds with evenly spaced and distinct voltage levels can be generated at a given time by selecting two opposite tabs in the ring of resistors appropriately (i.e., by not connecting tab0 and tab8 to a first reference level ($V_{DD}$) and a second reference level ($V_{SS}$)). Preferably, the two opposite tabs "asymmetrically" split the resistor string between adjacent tabs of the four pre-selected tabs (e.g., resistor string between [tab2,tab14], resistor string between [tab14,tab10], resistor string between [tab10,tab6], and resistor string between [tab6,tab2]). For instance, tab15 and tab7 can be connected to a first reference level ($V_{DD}$) and a second reference level ($V_{SS}$) to asymmetrically divide the resistor string between [tab2,tab14] and the resistor string between [tab10,tab6]. The asymmetry between adjacent tabs can allow, in one example, four different/distinct voltage levels to be generated at the pre-selected pairs of tabs (e.g., [tab14,tab6], [tab10,tab2], [tab6,tab14], and [tab2,tab10]).

FIGS. 5A-F illustrates an illustrative ring of resistors undergoing a "step by two" rotation of connections in a ring of resistors for generating four distinct voltage levels as comparator thresholds, according to some embodiments of the disclosure. In this example, the pre-selected pairs of tabs (i.e., in this example, [tab14,tab6], [tab10,tab2], [tab6, tab14], and [tab2,tab10]) generates four comparator thresholds (with distinct voltage levels), and the pre-selected pairs of tabs are directly connected to four comparators (respectively). Two switches are provided at each one of tab15, tab13, tab11, tab9, tab7, tab5, tab3, and tab1 (every two positions in the ring of resistors), which can connect the respective tab to either to the first reference level ($V_{DD}$) or the second reference level ($V_{SS}$).

Figure 5C:
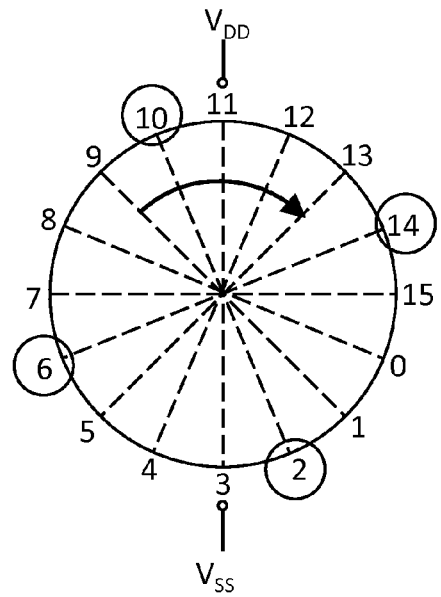
Figure 5D:
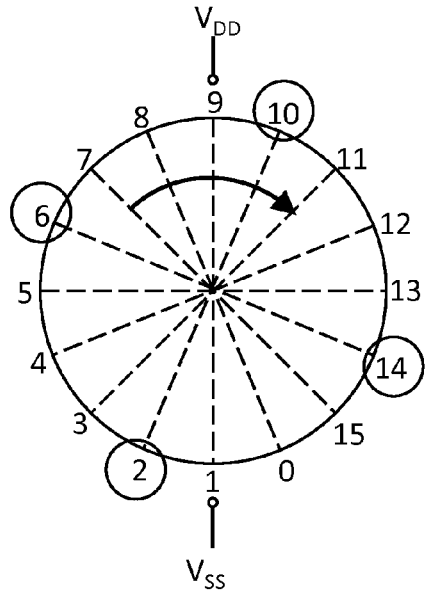
Figure 5E:
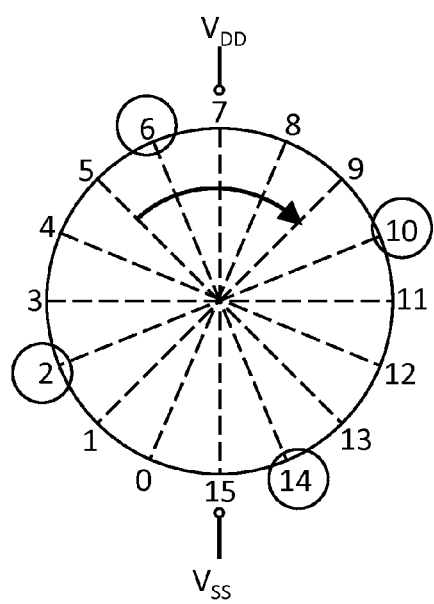
Figure 5F:
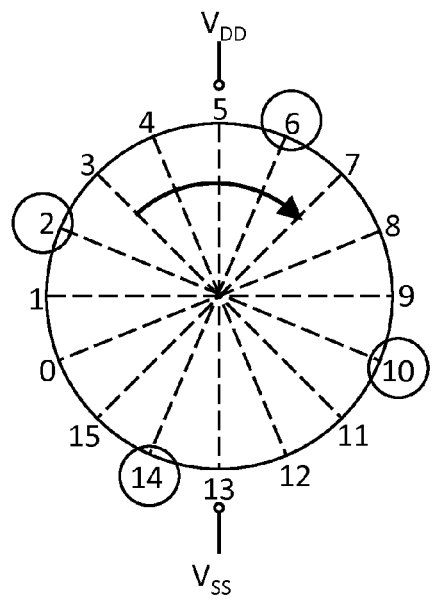
Figure 6:
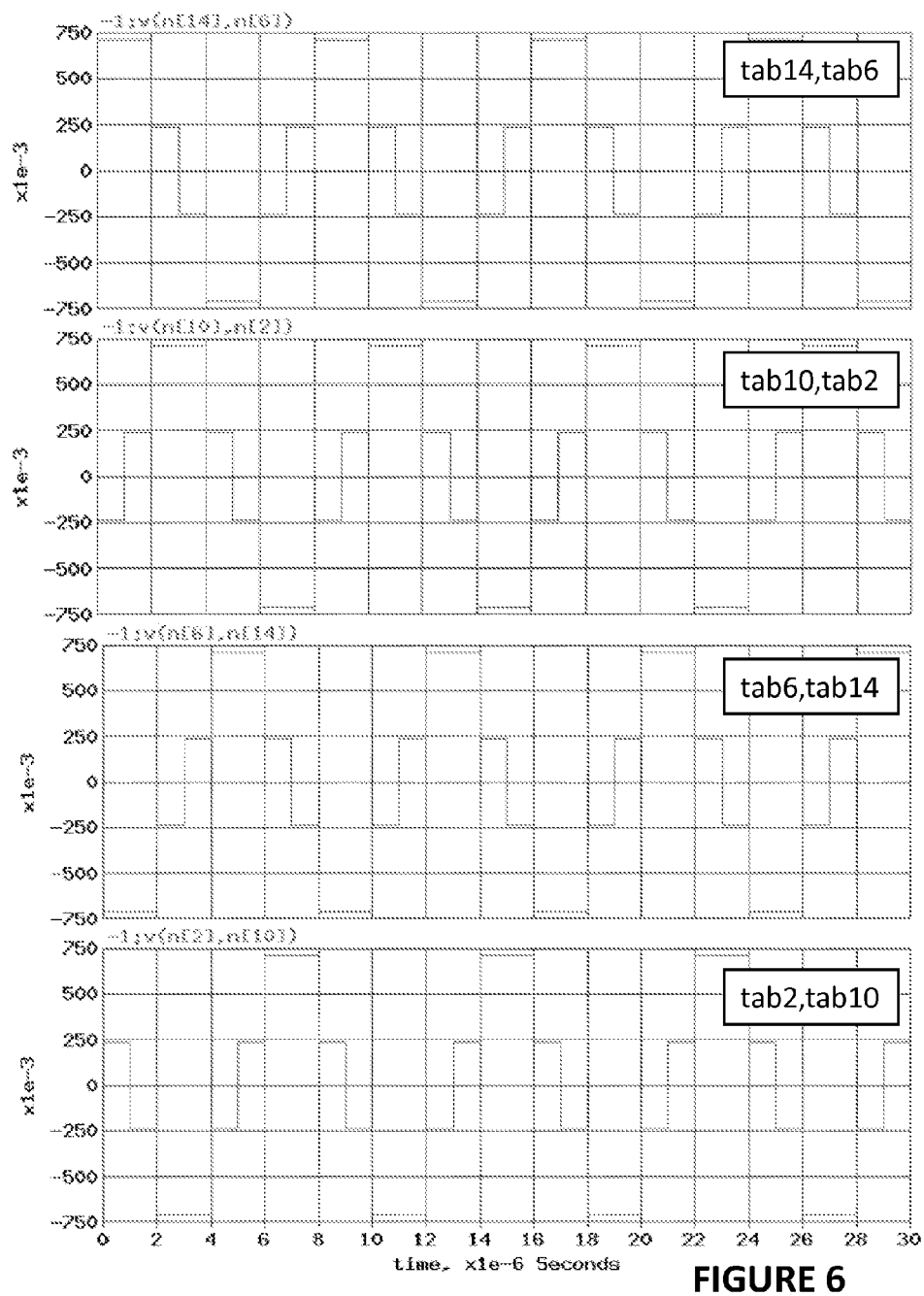
FIG. 6 shows voltage plots for comparator thresholds being generated at pre-selected pairs of tabs at a given time as the illustrative ring of resistors undergo the "step by two" rotation of connections, according to some embodiments of the disclosure.

FIG. 5A shows at a first time period where the two selected tabs are tab15 (connected to $V_{DD}$) and tab7 (connected to $V_{SS}$). FIG. 5B shows at a second time period where the two selected tabs are tab13 (connected to $V_{DD}$) and tab5 (connected to $V_{SS}$). FIG. 5C shows at a second time period where the two selected tabs are tab11 (connected to $V_{DD}$) and tab3 (connected to $V_{SS}$). FIG. 5D shows at a third time period where the two selected tabs are tab9 (connected to $V_{DD}$) and tab1 (connected to $V_{SS}$). FIG. 5E shows at a fifth time period where the two selected tabs are tab7 (connected to $V_{DD}$) and tab15 (connected to $V_{SS}$). FIG. 5F shows at a sixth time period where the two selected tabs are tab5 (connected to $V_{DD}$) and tab13 (connected to $V_{SS}$). This rotation can go on as needed, where the comparator thresholds are rotated between the time periods. FIG. 6 shows voltage plots for comparator thresholds being generated at pre-selected pairs of tabs at a given time as the illustrative ring of resistors undergo the "step by two" rotation of connections (e.g., as seen through FIGS. 5A-F), according to some embodiments of the disclosure. It can be seen from the voltage plots that a comparator threshold at given pre-selected pairs of tabs changes at most by a magnitude equal to one least significant bit each sample. A limitation on the change in magnitude can advantageously ensure the change in voltage for the comparator threshold settles quickly enough for high speed applications.

Shift Register Implementations for Generating Control Signals

Control signals control the switches that can be configured to connect tabs to either the first reference level or the second reference level. In the example shown in FIGS. 5A-B, there are 8 tabs connectable to either the first reference level or the second reference level for a "step by two" implementation. Accordingly, the circuit for rotating the connections can include 2*8=16 switches. A fast way to select the two selected tabs to connect to the first reference level and the second reference level respectively is to output 16 control signals based on a bit array which shifts by one position at a time. An example of a bit array based upon which 16 control signals can be generated may have two one's and 14 zero's to turn on the two switches connecting the two selected tabs to the first and second reference levels and turning off all other switches. In another example, the selection of one tab to connect to the first reference level also dictates which other tab to connect to the second reference level (since two opposite tabs are selected for connecting to the first reference level and the second reference level at a given time). A same control signal can thus be used to control two appropriate switches that connect two opposite tabs (as a predetermined pair) to the first reference level and the second reference level. Instead of using 16 control signals, a simpler way to select the two selected tabs to connect to the first reference level and the second reference level respectively is to output 8 control signals based on a bit array which shifts by one position at a time. An example of a bit array based upon which 8 control signals can be generated may have 1 one's and 7 zero's to turn on the two switches connecting the two selected tabs to the first and second reference levels and turning off all other switches.

Such a bit array can shift by one position between time periods. The output of the flip-flops (i.e., based on the bit array) thus generates control signals which shift in position between time periods, and accordingly, the control signals can select the appropriate switches to turn on (i.e., connect to the appropriate reference level) and rotate the connections between time periods.

Such a functionality can be implemented using a shift register, comprising a ring of flip-flops where the output of each flip-flop is provided to the data input of the next flip-flop in the ring. The configuration results in a circuit that shifts a bit array maintained by the states of the flip-flops by shifting in the data input present at each input of the flip-flops and shifting out the previously present data at the input as output every time period. Advantageously, the shift register generates the control signals in parallel and has an input-to-output delay equal to one flip-flop delay, making the shift register ideal for high speed applications where control over the input-to-output delay is important. Generally speaking, the shift register comprises a plurality of flip-flops for generating the control signals in parallel, wherein the number of flip-flops is at most the number of switches. Further to the flip-flops, the shift register can include a plurality of multiplexers for selecting inputs to the flip-flops.

Figure 7:
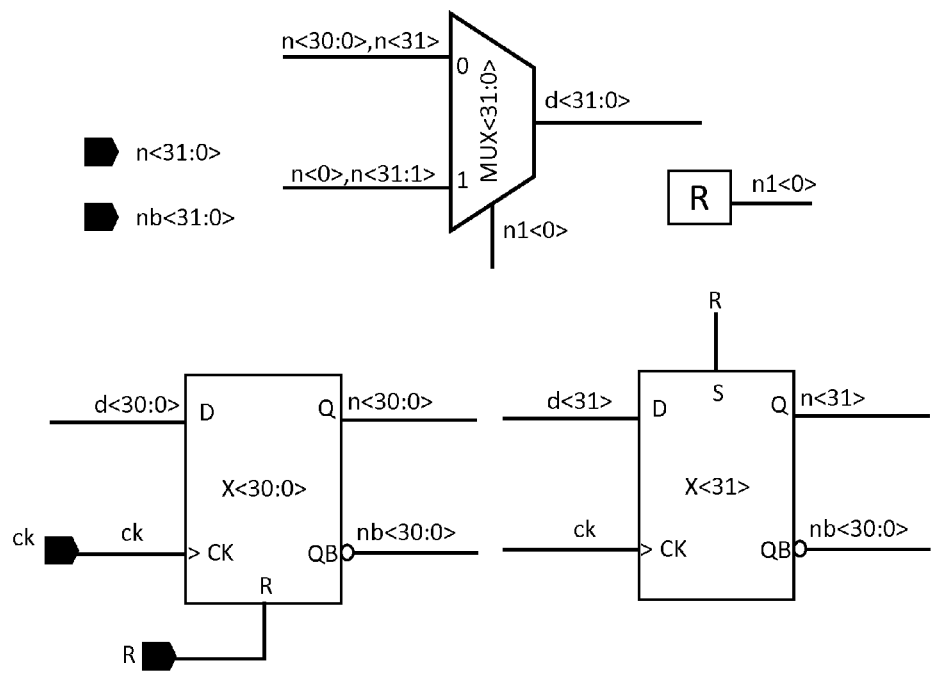
FIG. 7 shows an exemplary schematic for generating control signals to implement a fast rotation of connections for a ring of resistors, according to some embodiments of the disclosure.

FIG. 7 shows an exemplary schematic for generating control signals to implement a fast rotation of connections for a ring of resistors, according to some embodiments of the disclosure. Specifically, the schematic shows the structure for shifting a bit array by one position at a time to generate 32 control signals for a plurality of switches based on the bit array. In this example, there are 32 flip-flops (X<30:0> and X<31>) arranged in a ring configuration with 32 multiplexers (MUX<31:0>) that operate with the 32 flip-flops. The multiplexers can provide a special function to allow the shift register to execute two functions, i.e., shift the control signals/bit array by one in a first direction, and shift the control signals/bit array by one in a second direction (opposite from the first direction), by selectively routing appropriate outputs of the flip-flops as data input to the inputs of each flip-flop. A variant of the multiplexer of FIG. 7 can provide a special function to allow the shift register to execute two functions, i.e., shift the control signals by one in a first direction, and not shift the control signals, by selectively routing appropriate outputs of the flip-flops as data input to the inputs of each flip-flop.

Figure 8:
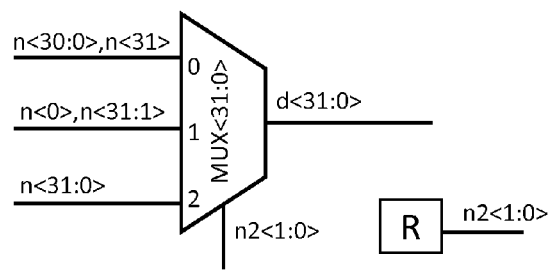
FIG. 8 shows a variant on the multiplexers of FIG. 7, according to some embodiments of the disclosure.

FIG. 8 shows a variant on the multiplexers of FIG. 7, according to some embodiments of the disclosure. In some embodiments, the multiplexers are controllable to shift the control signals/bit array in a first direction, to shift the control signals/bit array in a second direction opposite from the first direction, or not shift the control signals (where bit array does not shift, or remains the same between time periods), by selectively routing appropriate outputs of the flip-flops as data input to the inputs of each flip-flop.

The multiplexer shown in FIGS. 7 and 8 (and variants thereof) provides programmability to the user to control when and if the connections (that are controlled by control signals based on the bit array of the shift register) should be rotated between time periods. This implementations merely illustrates examples for understanding, and are not intended to be limiting. For instance, the schematic can be adapted by one skilled in the art to generate other numbers of control signals (e.g., using a different number of flip-flops and multiplexers).

Randomizing Rotation

In some cases, the multiplexers are controlled by a control signal which triggers the bit array to be shifted in a particular direction periodically, e.g., every N number of clock cycles. Such rotation is fixed, and can show up as a fixed tone in the output spectrum due to its periodicity. If desired, the multiplexer can be controlled by a randomized control signal, e.g., generated by a random number generator "R" (seen in FIGS. 7 and 8). For instance, when a rotation is due at a particular clock cycle, rotation may or may not occur due to randomization. The randomized control signal can control the multiplexer to effectively randomize the routing of outputs of the flip-flops as data input to the inputs of each flip-flop. According to some aspects, the direction of routing and/or the timing of the rotation can be randomized.

The randomized control signal can, according to a desired probability distribution, affect the periodicity of the rotation. In some cases, the randomized control signal can, for a given clock cycle due to rotate (or not rotate) the bit array, randomly (1) shift the control signals in a first direction, or (2) not shift the control signals. In some cases, the randomized control signal can, for a given clock cycle due to rotate the bit array, randomly (1) shift the control signals in a first direction, or (2) shift the control signals in a second direction opposite from the first direction. In some cases, the randomized control signal can, for a given clock cycle due to rotate (or not rotate) the bit array, randomly (1) shift the control signals in a first direction, (2) shift the control signals in a second direction opposite from the first direction, or (3) not shift the control signals. In some cases, the randomized control signal can randomize the number of clock cycles between rotations (if desired, in addition to randomizing the direction of rotation).

Adding suitable randomization to the rotation of the shift register can move certain tones in the output spectrum (associated with a fixed rotation) to very low frequencies (special case, to DC), or spread the tones into the noise floor, or move the tone to a location that is tolerable for a particular application, or move the tone to outside of the desired band of interest.

Method for Fast Rotation of Connections

Figure 9:
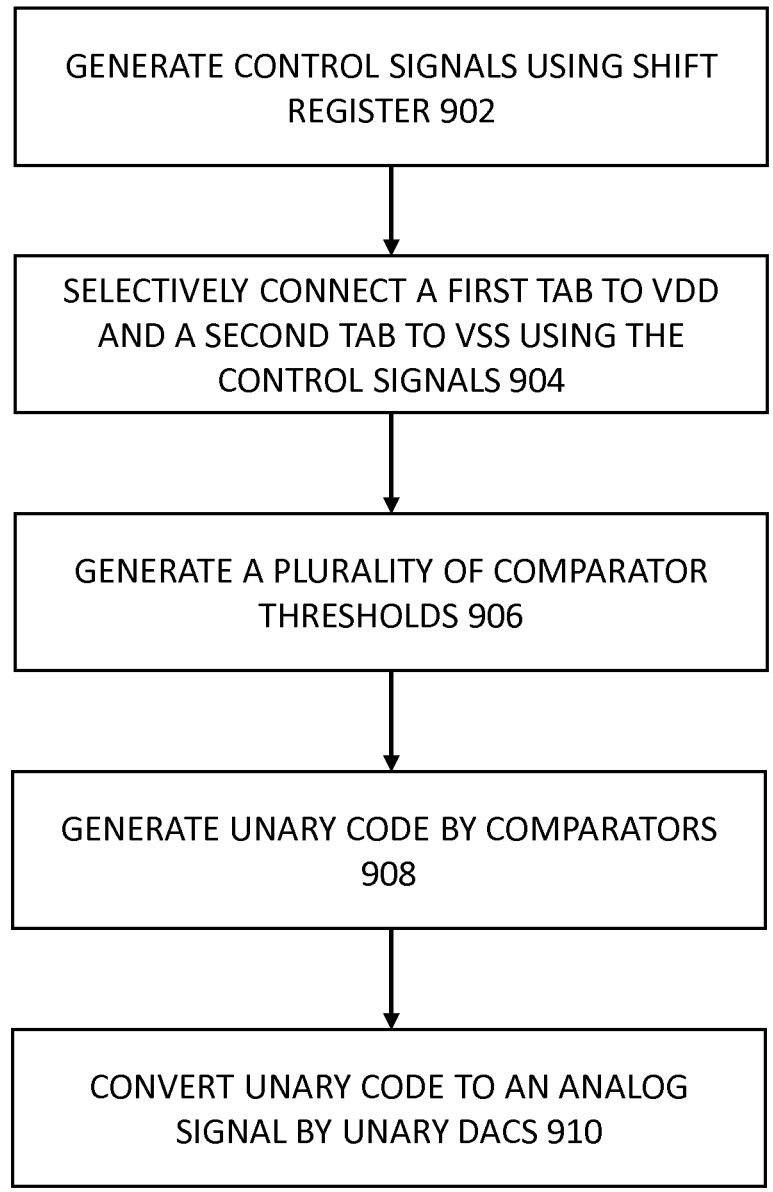
FIG. 9 shows a flow diagram illustrating a method for fast rotation of connections of a ring of resistors configured for generating comparator thresholds for an array of comparators, said array of comparators configured to drive an array of digital-to-analog converter elements, according to some embodiments of the disclosure.

FIG. 9 shows a flow diagram illustrating a method for fast rotation of connections of a ring of resistors configured for generating comparator thresholds for an array of comparators, said array of comparators configured to drive an array of digital-to-analog converter elements, according to some embodiments of the disclosure. The illustrated method can be carried out by a circuit according to the architecture of FIG. 2. The illustrated method can also be carried out by an integrated circuit having fast rotation of connections, the integrated circuit comprising: means for shifting a bit array by one position at a time to generate control signals for a plurality of switches based on the bit array, the plurality of switches configured to connect tabs between resistors in a ring of resistors to a first reference level or to a second reference level; and means for selectively connecting, using the control signals, a first selected tab to the first reference level and a second selected tab to the second reference level to generate a plurality of comparator thresholds at a plurality of pre-selected pairs of tabs in the ring of resistors; means for generating a unary code based an input signal to each of the comparators and the plurality of comparator thresholds; and means for converting the unary code into a quantized analog signal, whose error caused by element mismatch are reduced by the rotation of connections.

The illustrated method comprises generating, using a shift register, control signals for a plurality of switches configured to connect tabs between resistors in a ring of resistors to a first reference level or to a second reference level (task 902), selectively connecting, using the control signals, a first selected tab to the first reference level and a second selected tab to the second reference level (task 904) to generate a plurality of comparator thresholds at a plurality of pre-selected pairs of tabs in the ring of resistors (task 906). In some embodiments, the method further includes generating, by the array of comparators, a unary code based an input signal to each of the comparators and the plurality of comparator thresholds (task 908), and converting, by the array of (unary) digital-to-analog converter elements, the unary code into a quantized analog signal, whose error caused by element mismatch are reduced by the rotation of connections (task 910).

"Step by Two" Versus "Step by Four"

Figure 10:
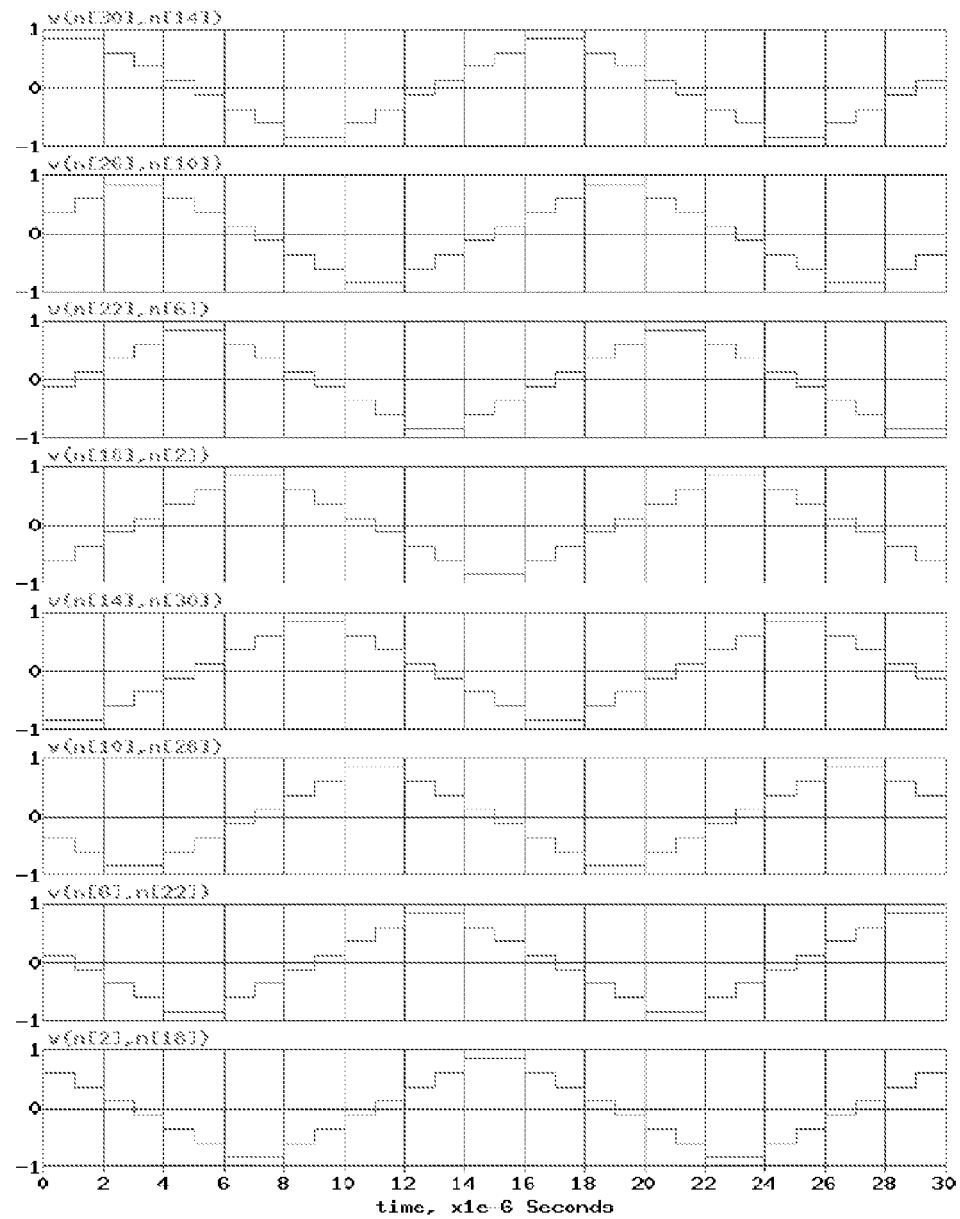
FIG. 10 shows voltage plots for comparator thresholds being generated at pre-selected pairs of tabs at a given time as the illustrative ring of resistors undergo the "step by two" rotation of connections, according to some embodiments of the disclosure.

As previously illustrated by FIGS. 5A-F, comparator thresholds can be "rotated" by a "step by two" technique of rotating the connections by two positions over the ring of resistors between time periods. FIG. 10 shows voltage plots for comparator thresholds being generated at pre-selected pairs of tabs at a given time as the illustrative ring of resistors undergo the "step by two" rotation of connections, according to some embodiments of the disclosure. It can be seen that, using this technique, a comparator threshold at any given pre-selected pairs of tabs changes at most by a magnitude equal to one least significant bits between time periods.

Figure 11:
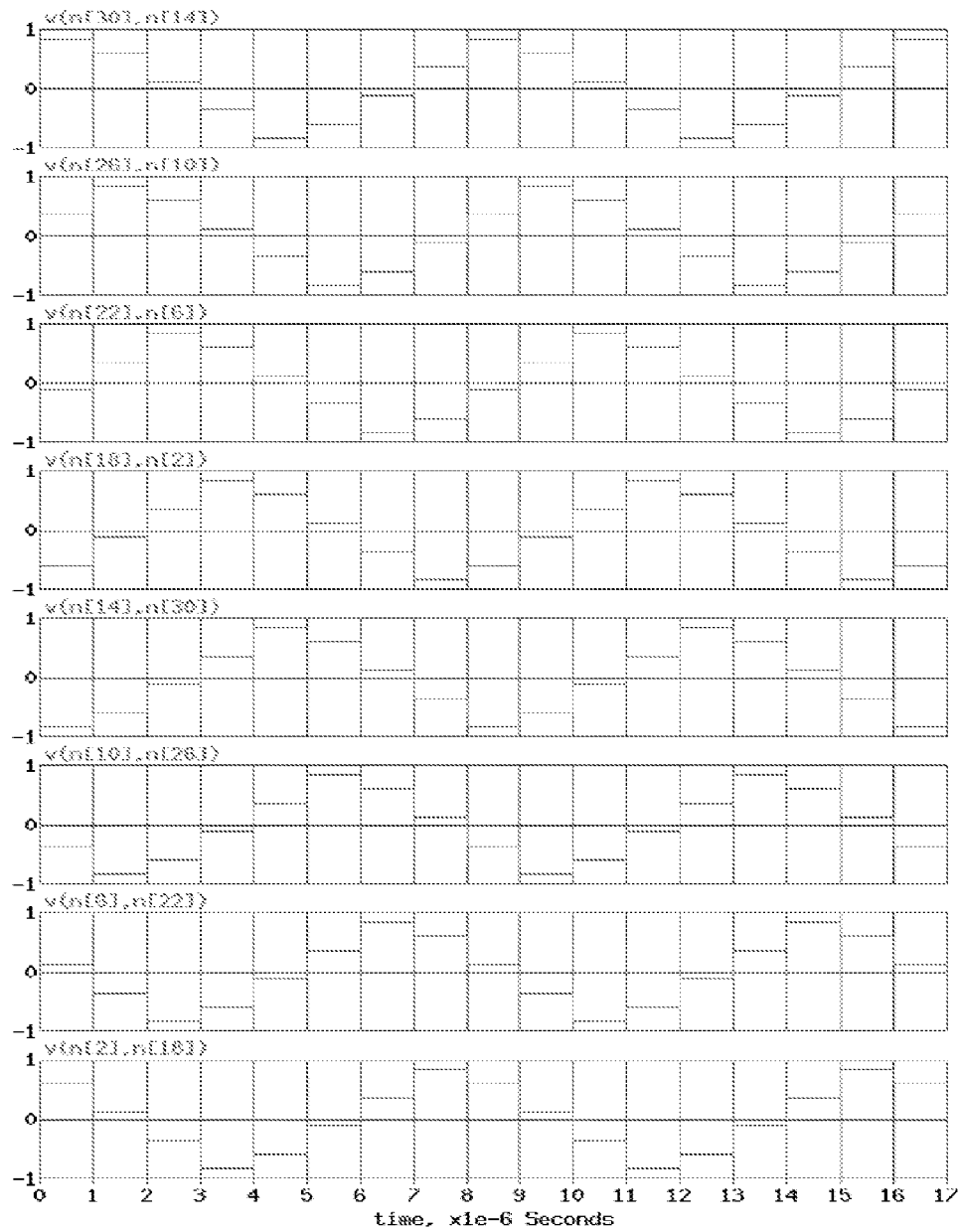
FIG. 11 shows voltage plots for comparator thresholds being generated at pre-selected pairs of tabs at a given time as the illustrative ring of resistors undergo the "step by four" rotation of connections, according to some embodiments of the disclosure.

Instead of rotating the connections by two positions over, it is possible to rotate the connections by other numbers of positions, e.g., by four positions over (or some other suitable number of positions over). By moving more positions between time periods, it is possible to reduce the number of switches needed for connecting tabs to the first reference level and the second reference level. By reducing the number of switches needed, it is also possible to reduce the number of flip flops and multiplexers of the shift register generating control signals for those switches. FIG. 11 shows voltage plots for comparator thresholds being generated at pre-selected pairs of tabs at a given time as the illustrative ring of resistors undergo the "step by four" rotation of connections, according to some embodiments of the disclosure. It can be seen that, using this technique, a comparator threshold at any given pre-selected pairs of tabs changes at most by a magnitude equal to two least significant bits between time periods. Circuit complexity is reduced for the "step by four" case in comparison to the "step by two" case, while settling time is potentially increased due to more magnitude change in voltage between time periods.

Circuit Complexity Considerations

Generally speaking, the circuit complexity is dictated by the number of comparator thresholds voltage levels to be generated and the amount (or magnitude) of change in voltage for any given comparator threshold desired between time periods. The tabs between the resistors in the ring of resistors have respective positions in the ring.

In some embodiments, the plurality of switches are provided for tabs in every position. For instance, two switches are provided for each and every tab in the ring of resistors. Accordingly, the number of switches is at most twice the number of tabs between resistors in the ring of resistors. But in some embodiments, the plurality of switches are not provided for (all) tabs in every positions. Only a subset of tabs are provided with switches that connects the tab to the first reference level or the second reference level.

In some embodiments, the plurality of switches are provided for connecting tabs in every two positions. This implementation can allow a "step by two" technique to be used to rotate connections over the ring of resistors. For instance, two switches are provided for tabs in every two positions. Accordingly, the number of switches is at most the number of tabs between resistors in the ring of resistors.

In some embodiments, the plurality of switches are provided for connecting tabs in every four position. This implementation can allow a "step by four" technique to be used to rotate connections over the ring of resistors. For instance, two switches are provided for tabs in every four positions. Accordingly, the number of switches is at most half the number of tabs between resistors in the ring of resistors.

Variations and Implementations

In certain contexts, the overall analog-to-digital converter discussed herein can be applicable to medical systems, scientific instrumentation, wireless and wired communications, radar, industrial process control, audio and video equipment, current sensing, instrumentation, communication systems, and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. Complementary or equivalent configurations (using BJTs in place of PMOS or NMOS transistors) would be considered interchangeable with embodiments described herein using MOSFET transistors to a person with ordinary skill in the art.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, supporting applications to the circuits described herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of elements, inputs and output connections, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to fast rotation of connections for a ring of resistors, illustrate only some of the possible functions that may be carried out or provided by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for generating comparator thresholds at a plurality of nodes in a ring of resistors which is created by resistors in series forming a loop, the method comprising:
coupling a first node and a second node in the ring of resistors to a first reference level and to a second reference level respectively to generate comparator thresholds at the plurality of nodes in the ring of resistors; and
coupling a third node and a fourth node in the ring of resistors to the first reference level and to the second reference level respectively to change the plurality of comparator thresholds at the plurality of nodes in the ring of resistors.

2. The method of claim 1, further comprising:
generating, by an array of comparators, a unary code based on an input signal to each of the comparators and the plurality of comparator thresholds; and
converting, by an array of digital-to-analog converter elements, the unary code into a quantized analog signal, whose error caused by element mismatch are reduced by the change in the plurality of comparator thresholds generated at the plurality of nodes in the ring of resistors.

3. The method of claim 1, wherein:
the nodes in the ring of resistors have respective positions in the ring; and
the method further comprises selecting the third node and the fourth node by shifting a first position associated with the first node and a second position associated with the second node by a pre-selected number of positions between time periods.

4. The method of claim 3, wherein:
the pre-selected number of positions is two.

5. The method of claim 1, wherein:
a comparator threshold at any given pre-selected pairs of nodes in the ring of resistors changes at most by a magnitude equal to one least significant bit between time periods.

6. The method of claim 3, wherein:
the pre-selected number of positions is at least four.

7. The method of claim 1, wherein:
a comparator threshold at any given pre-selected pairs of nodes in the ring of resistors changes at most by a magnitude equal to two least significant bits between time periods.

8. A circuit comprising:
a ring of resistors having resistors in series forming a loop and nodes between resistors;
a plurality of switches, each controllable for connecting a node in the ring of resistors to a first reference level or to a second reference level;
a shift register for generating control signals for the plurality of switches, wherein the control signals selectively connect a first selected node to the first reference level and a second selected node to the second reference level to generate a plurality of comparator thresholds at a plurality of pre-selected pairs of nodes in the ring of resistors; and
an array of comparators to drive an array of digital-to-analog converter elements, wherein each comparator is connected to a respective pre-selected pair of nodes in the ring of resistors.

9. The circuit of claim 8, wherein:
the shift register comprises a plurality of flip-flops for generating the control signals in parallel, and a plurality of multiplexers for selecting inputs to the flip-flops.

10. The circuit of claim 8, wherein:
the shift register comprises a plurality of multiplexers for selecting inputs to the flip-flops; and
the plurality of multiplexers are controllable to shift the control signals in a first direction or in a second direction opposite from the first direction.

11. The circuit of claim 10, wherein the plurality of multiplexers are controlled with a randomized control signal.

12. The circuit of claim 8, wherein:
the shift register comprises a plurality of multiplexers for selecting inputs to the flip-flops; and
the plurality of multiplexers are controllable to shift the control signals in a first direction, to shift the control signals in a second direction opposite from the first direction, or not shift the control signals.

13. The circuit of claim 12, wherein the plurality of multiplexers are controlled with a randomized control signal.

14. The circuit of claim 8, wherein:
the nodes between the resistors in the ring of resistors have respective positions in the ring; and
the plurality of switches are not provided for nodes in every position.

15. The circuit of claim 8, wherein:
the nodes between the resistors in the ring of resistors have respective positions in the ring; and
the plurality of switches are provided for connecting nodes in every two positions.

16. The circuit of claim 8, wherein:
the nodes between the resistors in the ring of resistors have respective positions in the ring; and
the plurality of switches are provided for connecting nodes in every four positions.

17. The circuit of claim 8, wherein:
the shift register comprises a plurality of flip-flops for generating the control signals in parallel; and
wherein the number of flip-flops is at most the number of switches.

18. An integrated circuit comprising:
a first circuit to generate a bit array which shifts by one position at a time; and
a second circuit to output control signals based on the bit array, wherein the control signals selectively couples a first selected node in a ring of resistors to a first reference level and a second selected node in the ring of resistors to a second reference level to change the plurality of comparator thresholds at a plurality of pre-selected pairs of nodes in the ring of resistors;
comparators to generate a unary code based on an input signal to each of the comparators and the plurality of comparator thresholds; and
converter elements to convert the unary code into a quantized analog signal, whose error caused by element mismatch are reduced by the selective coupling of nodes to the first and second reference levels.

19. The integrated circuit of claim 18, further comprising a third circuit to generate a randomized control signal for randomly (1) shifting the control signals in a first direction, or (2) not shifting the control signals.

20. The integrated circuit of claim 18,
further comprising a fourth circuit to generate a randomized control signal for randomly (1) shifting the control signals in a first direction, (2) shifting the control signals in a second direction opposite from the first direction, or (3) not shifting the control signals.

* * * * *